(12) United States Patent
Ishikawa et al.

(10) Patent No.: US 7,019,231 B2
(45) Date of Patent: Mar. 28, 2006

(54) INERTIAL SENSOR

(75) Inventors: Hiroshi Ishikawa, Kawasaki (JP);
Yoshitaka Nakamura, Yokohama (JP);
Hiroshi Tokunaga, Yokohama (JP);
Kenji Nagata, Yokohama (JP)

(73) Assignees: Fujitsu Media Devices Limited,
Yokohama (JP); Fujitsu Limited,
Kawasaki (JP)

( * ) Notice: Subject to any disclaimer, the term of this patent is extended or adjusted under 35 U.S.C. 154(b) by 0 days.

(21) Appl. No.: 11/091,456

(22) Filed: Mar. 29, 2005

(65) Prior Publication Data

US 2005/0217373 A1    Oct. 6, 2005

(30) Foreign Application Priority Data

Mar. 30, 2004   (JP) .............................. 2004-099161

(51) Int. Cl.
*H01H 35/14*   (2006.01)
(52) U.S. Cl. .............................. 200/61.45 R; 73/514.36
(58) Field of Classification Search .............. 200/61.45 R–61.53; 73/514.01, 514.15, 514.16, 514.29, 73/514.31, 514.35, 514.36, 514.37, 514.38, 73/526
See application file for complete search history.

(56) References Cited

U.S. PATENT DOCUMENTS

| | | | | | |
|---|---|---|---|---|---|
| 5,277,064 | A | * | 1/1994 | Knigga et al. | 73/514.14 |
| 5,284,057 | A | * | 2/1994 | Staller et al. | 73/514.36 |
| 5,635,739 | A | * | 6/1997 | Grieff et al. | 257/254 |
| 6,130,464 | A | * | 10/2000 | Carr | 257/417 |
| 6,214,243 | B1 | * | 4/2001 | Muenzel et al. | 216/2 |
| 6,272,926 | B1 | * | 8/2001 | Fehrenbach et al. | 73/514.32 |
| 6,360,605 | B1 | * | 3/2002 | Pinter et al. | 73/514.38 |
| 2003/0209075 | A1 | | 11/2003 | Okada | |

FOREIGN PATENT DOCUMENTS

| | | |
|---|---|---|
| EP | 0 490 419 A1 | 6/1992 |
| EP | 1 491 901 A1 | 12/2004 |
| JP | 3-114272 A | 5/1991 |
| JP | 8-327656 A | 12/1996 |
| JP | 2000-187041 A | 7/2000 |
| JP | 2003-392702 A | 11/2003 |
| JP | 2004-198243 A | 7/2004 |

* cited by examiner

*Primary Examiner*—Michael A. Friedhofer
(74) *Attorney, Agent, or Firm*—Arent Fox PLLC (57) ABSTRACT

An inertial sensor includes a sensing portion having a weight supported by beams, the weight being a movable portion, and a weight stopper that limits a movable range of the weight, the weight stopper being arranged in a vicinity of the weight with a given clearance and being a part of a substrate for the inertial sensor processed with MEMS techniques.

17 Claims, 9 Drawing Sheets

FIG. 12B

INERTIAL SENSOR

BACKGROUND OF THE INVENTION

1. Field of the Invention

This invention generally relates to inertial sensors, and more particularly, to an inertial sensor such as an acceleration sensor and a gyro having an excellent impact resistance.

2. Description of the Related Art

The inertial sensor such as the acceleration sensor and the gyro has been downsized, more sophisticated, and reduced in price in these years, with advancements of microfabrication technology employing MEMS (Micro-Electro-Mechanical System) techniques. With the above-mentioned background, the inertial sensor as a MEMS device is expected to be used for a car navigation system, automotive air-bag control, avoidance of jiggling a camera or camcorder, mobile telephone, robot posture control, gesture input recognition for a game, and detection of HDD rotation and impact applied to HDD. The inertial sensor is expected to be employed in every device for detecting movements.

An unexpected big impact is sometimes applied to the device that detects the movements. Therefore, there is a possibility that the big impact is applied to the inertial sensor mounted on the above-mentioned device. For instance, with respect to the inertial sensor used for an automobile such as a vehicle air bag, if a car crushes or overturns, the big impact, never happening during the normal driving, will be possibly applied. If a mobile device is mistakenly dropped, the big impact can be easily imagined. If a user roughly handles a game console for a hobby use, an extremely big impact will be applied to the game console. The above-mentioned accidental and unexpected impact is considered 3000 G or 5000 G, and a high impact resistance is demanded by the inertial sensor mounted on the above-mentioned device. A common inertial sensor has a fundamental structure including the weight, which is the movable portion, hung by the beams. In the case where the big impact is accidentally applied to the device, there is a known problem in that the beam is significantly distorted or damaged and the device no longer serves as a sensor. Japanese Patent Application Publication No. 2000-187041 (hereinafter referred to as Document 1) describes to solve the above-mentioned problem.

The capacitive acceleration sensor disclosed in Document 1 includes a protector provided on an insulating protective cover to sandwich a movable portion. If a big impact is applied and the movable portion hits the insulating protective cover, the movable portion is configured not to be damaged by the impact. According to Document 1, this protector protects the acceleration sensor from damage of the movable portion or malfunction of the acceleration measurement, if a device on which the sensor is mounted is dropped.

The acceleration sensor disclosed in Document 1, however, intends to solve the problem of the acceleration sensor having a configuration in which "the mass body 4a is supported in parallel and can be displaced by the interfaces between the glass substrates 6 and 7 and the silicon substrate 1 via the beam 4c" (refer to the paragraph 0005 of Document 1). In addition, the acceleration sensor has a configuration in which "the beam supporting the mass body 4Aa has a narrow width in proportion to the thickness thereof, and the mass body 4Aa is configured to have a difficulty of being displaced toward the glass substrates 6A and 7A" (refer to the paragraph 0026 of Document 1). The movable space of the movable portion is limited to a two-dimensional space substantially parallel to the interfaces of the glass substrates 6 and 7 and the silicon substrate 1.

Further, "the concave portion 6Aa having a depth of approximately 15 μm is formed on the surface facing the convex portion 4Ab of the mass body 4Aa in the glass substrate 6A. The aluminum layer 8 having a thickness of approximately 5 μm is coated as a protector to protect against the impact by vapor evaporation" (refer to the paragraph 0027 of Document 1). Thus obtained acceleration sensor does not have a possibility that the movable portion is damaged and becomes unable to measure the acceleration if the device on which the sensor is mounted is dropped. That is, the protector provided in the acceleration sensor disclosed in Document 1 is arranged on the glass substrate, on which the movable portion is not displaced in the normal operation of the acceleration sensor. There is a problem in that the invention disclosed in document 1 cannot be applied to an inertial sensor that serves primary functions when the movable portion moves in three dimensions in the normal operation.

SUMMARY OF THE INVENTION

It is a general object of the present invention to provide an inertial sensor such as an acceleration sensor or a gyro having a movable portion that moves in three dimensions.

A more specific object of the present invention is to provide the inertial sensor that can enhance an impact resistance thereof and does not have a possibility such that a movable portion is damaged or the acceleration cannot be measured.

According to an aspect of the present invention, preferably, there is provided a sensing portion having a weight supported by beams, the weight being a movable portion; and a weight stopper that limits a movable range of the weight, the weight stopper being arranged in a vicinity of the weight with a given clearance and being a part of a substrate for the inertial sensor processed with MEMS techniques.

The weight stopper, which is processed with the MEMS techniques, is arranged in the vicinity of the sensing portion. Thus, the weight stopper is capable of limiting the movement of the weight and prevents the weight from moving beyond a movable range that can be sensed by the sensor. Also, even in the case where the big impact is accidentally applied to the sensor, the weight stopper is capable of preventing the beams from being distorted significantly or damaged.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

An inertial sensor in accordance with the present invention includes a sensing portion shaped by processing a silicon substrate by the MEMS techniques. This sensing portion is mounted on a fixing member such as a glass substrate, and is hermetically sealed into a package to be used as a device.

Figure 1A:
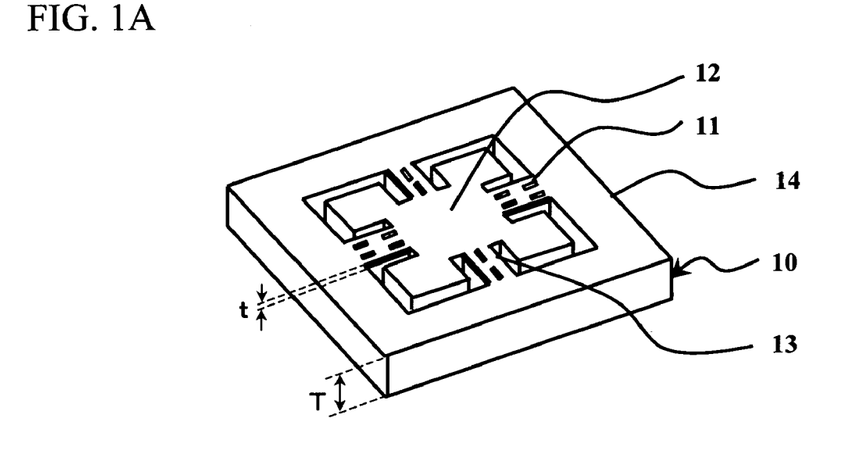
FIG. 1A is a perspective view of a sensing portion.
Figure 1B:
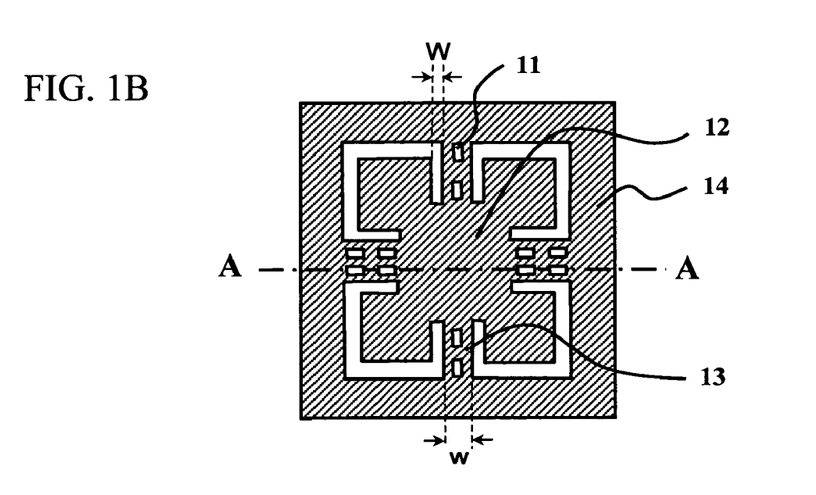
FIG. 1B is a plane view of the sensing portion shown in FIG. 1A.
Figure 1C:
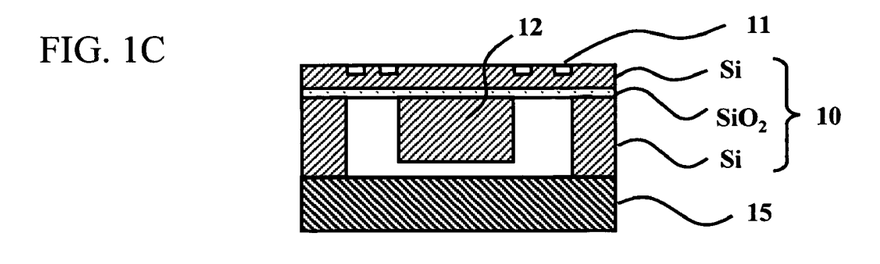
FIG. 1C is a cross-sectional view of the sensing portion mounted on a glass substrate.

FIGS. 1A through 1C schematically illustrate main components of the inertial sensor. FIG. 1A is a perspective view of the sensing portion. FIG. 1B is a plane view of the sensing portion. FIG. 1C is a cross-sectional view of the sensing portion mounted on the glass substrate.

Referring to FIGS. 1A through 1C, the inertial sensor includes an SOI substrate 10, piezoelectric resistors 11, a weight 12, beams 13, a frame 14, and a glass substrate 15. The SOI substrate 10 forms the sensing portion of the inertial sensor. The piezoelectric resistors 11 are formed in the SOI substrate 10 by a process described later in detail. The weight 12 is a movable portion of the sensing portion. The beams 13 support movements of the weight 12. The frame 14 supports the beams 14, and holds the weight 12. Movement of the weight 12 that is the movable portion moves causes the beams 13 to twist or bend, and changes the resistance values of the piezoelectric resistors 11 provided on the beams 13. Changes in the resistance values are available as electric signals output by a Wheatstone bridge circuit. A reference numeral W denotes a gap, w denotes a width of the beams 13, T denotes a thickness of the weight 12, and t denotes a thickness of the beams 13.

Several methods can be considered in order to improve the impact resistance of the inertial sensor in which the weight 12 is supported by the beams 13. For example, the strength of the beam 13 is increased, or the weight 13 supported by the beams 13 is designed to have a decreased weight to reduce a mechanical burden applied to the beams 13.

Generally, however, the impact resistance is inversely proportional to the sensor sensitivity. An increase in the impact resistance decreases the sensor sensitivity. For example, in case where the beams 13 have an increased thickness, an increased width or a shortened length in order to enhance the mechanical strength of the beams, the weight 12 will have insensitive movement in the normal operation. This may cause only small changes in the resistance values of the piezoelectric resistors 11 provided on the beams 13, and degrades the sensor sensitivity. Similar problems will arise from the use of the weight 12 having a reduced weight.

In order to avoid the above-mentioned drawbacks and realize the inertial sensor having the excellent impact resistance, the inertial sensor includes a weight stopper to limit the weight 12 within a given movable range in accordance with the present invention. The stopper restrains a movement of the weight 12 in excess of a specified sensing range of the sensor. It is thus possible to avoid a problem such that the beams are damaged or distorted by accidental large shock and lose the sensing function. Preferably, the weight stopper is produced using the MEMS techniques and is arranged in the vicinity of the sensing portion.

A description will be given of embodiments of the weight stopper included in the inertial sensor in accordance with the present invention.

Figure 2A:
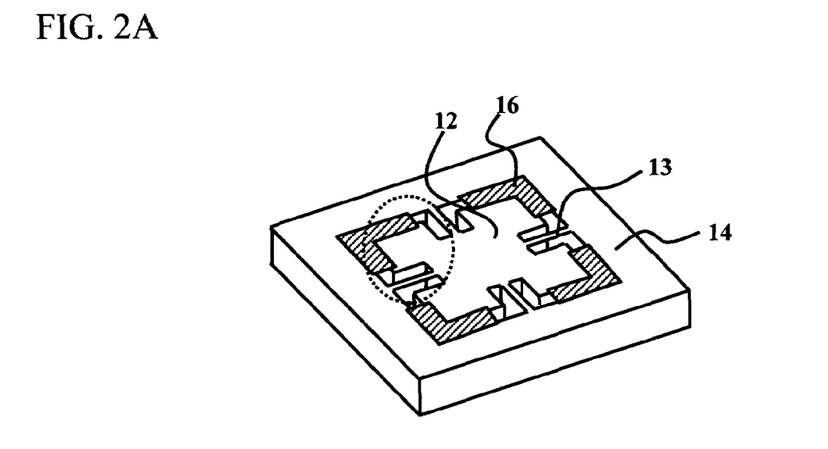
FIGS. 2A through 2D schematically show shapes of weight stoppers, which are arranged on a silicon film of an SOI substrate by MEMS techniques.
Figure 2B:
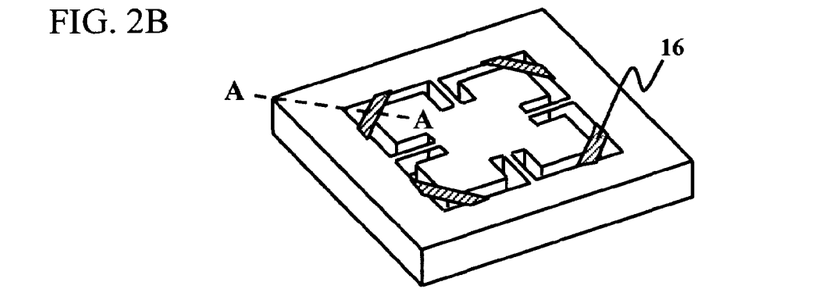
Figure 2C:
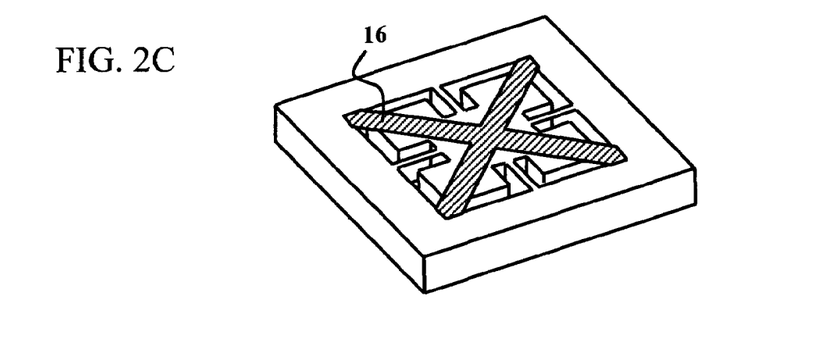
Figure 2D:
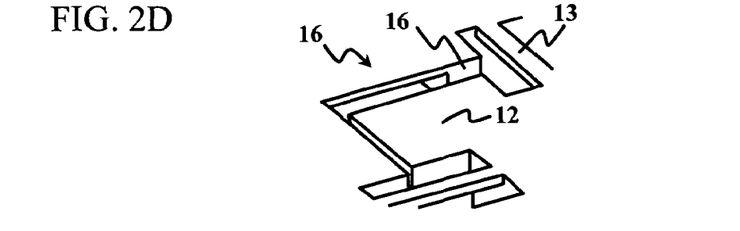

FIGS. 2A through 2D schematically illustrate shapes of the weight stopper in the case where the above-mentioned weight stopper is shaped into a part of a silicon film of the SOI substrate with the MEMS techniques. Weight stoppers 16 partially cover a gap between the frame 14 that supports the beams 13 and the weight 12, and extend towards the weight 12 from the frame 14. The weight stoppers 16 are arranged above the weight 12 with a given clearance, for example, 5 μm. The weight stoppers 16 stop the movement of the weight 12 when the impact is applied to the weight 12 and the weight 12 starts moving and exceeds the original movable range. It is to be noted that FIGS. 2A through 2D show exemplary arrangements of the weight stopper 16, which can be designed taking into account several conditions in terms of the MEMS process, the required limited movement of the weight and so on. As shown in FIG. 2D that shows an enlarged view of a portion indicated by the dotted line in FIG. 2A, a column portion 16' may be provided to improve the strength of some parts of the weight stoppers 16.

Figure 3A:
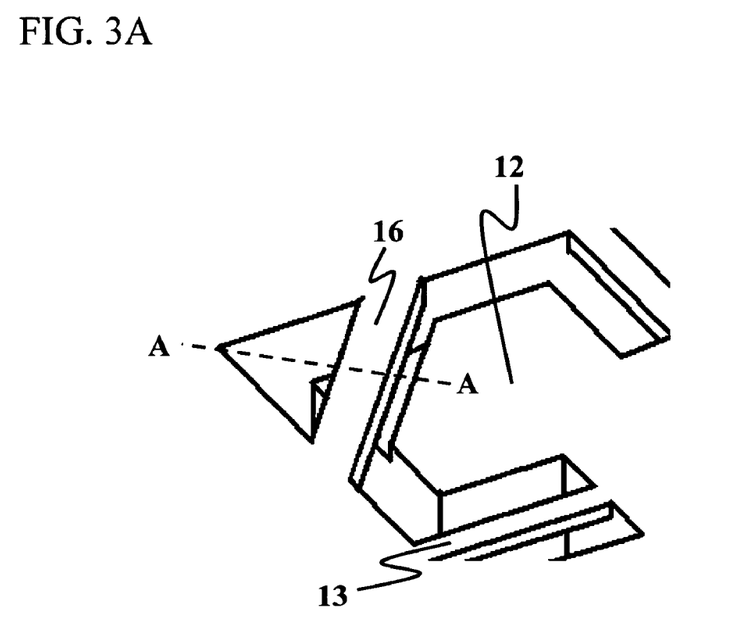
FIGS. 3A and 3B illustrate a structure of a weight stopper in detail.
Figure 3B:
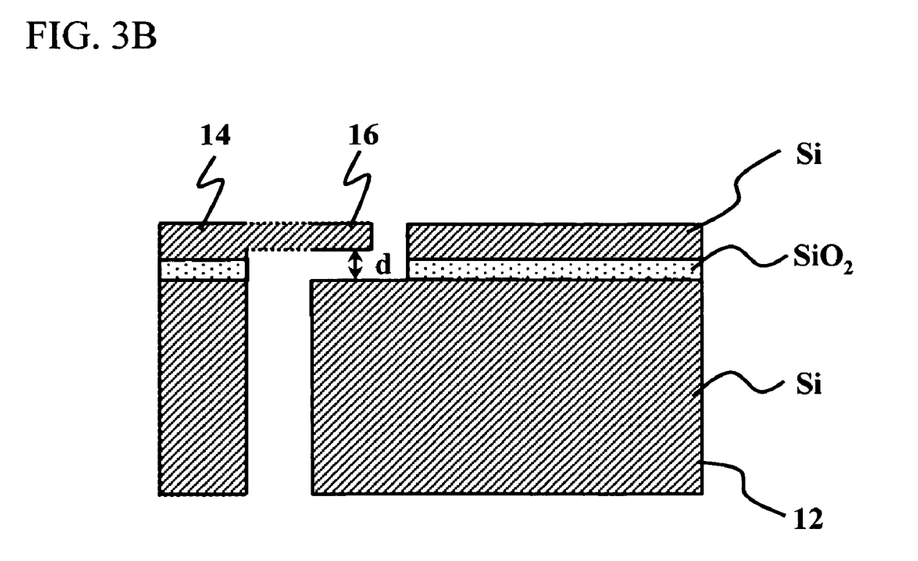

FIGS. 3A and 3B illustrate a structure of the weight stopper in detail. More particularly, FIG. 3A is a perspective view of the weight stopper 16 and the weight 12 shown in FIG. 2B, and FIG. 3B is a cross-sectional view taken along a line A—A shown in FIG. 2B. Referring to FIG. 3A, a trimmed portion is arranged in a part of the weight 12 that faces the weight stopper 16. The depth of the trimmed portion determines the clearance. FIG. 3B shows the clearance defined by the trimmed portion. The weight 12 and the frame 14 are integrally formed, with the MEMS techniques, on the SOI substrate such as a bonded SOI wafer. The weight stopper 16 horizontally extends from the frame 14, which is formed by the upper silicon crystal layer of the SOI substrate, and covers a part of the frame with the clearance d. The weight stoppers shown in FIGS. 2A and 2C also have similar clearances respectively, and a description with the drawings is omitted here.

As long as the weight 12 moves within the movable range smaller than the clearance d, which corresponds to the dynamic range of the sensor, the weight stopper 16 does not restrain the movement of the weight 12. In the case where the impact is applied to the sensor and the weight 12 moves beyond the movable range equal to or larger than the clearance d, the weight stopper 16 restrains the movement of the weight 12 to prevent the sensor from being damaged.

Now, a description will be given of an example of a process of fabricating the inertial sensor in accordance with the present invention.

Figure 4A:
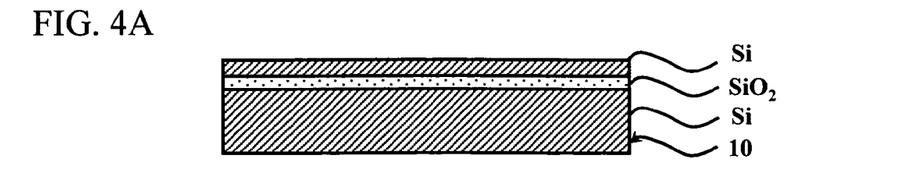
FIGS. 4A through 4F illustrate a process of fabricating weight stopper on the silicon film of the SOI substrate.
Figure 4B:
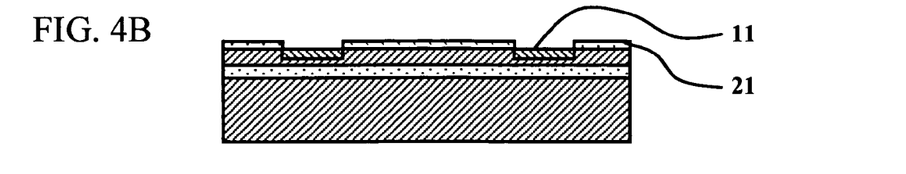

FIGS. 4A through 4F and 5A through 5E illustrate a fabricating process in which the weight stoppers are formed by the silicon film of the SOI substrate. Referring to FIG. 4A, the SOI substrate 10 is prepared which has a diameter of four inches, and has a layer structure of Si(15 µm)/SiO$_2$(1 µm)/Si(500 µm). As shown in FIG. 4B, the main surface (the silicon film having a thickness of 15 µm) of the SOI substrate 10 is oxidized to form an oxide film 21 and openings are arranged for ion-implantation in given regions. The oxide film 21 and a resist (not shown) are provided on the oxide film 21 and are used as a mask with which boron is ion-implanted to provide boron-diffused regions, which are the piezoelectric resistors 11. Then, the substrate 10 is thermally treated at 800–1300° C. to perform thermal oxidization again, so that an oxide film 22 thicker than the oxide film 21 can be formed.

Figure 4C:
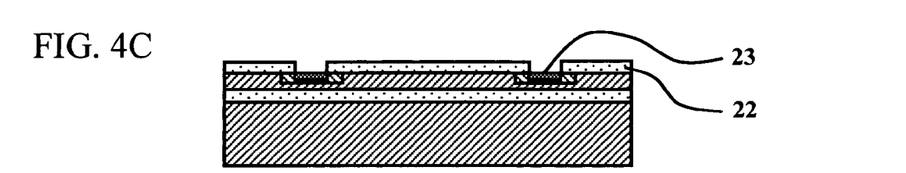
Figure 4D:
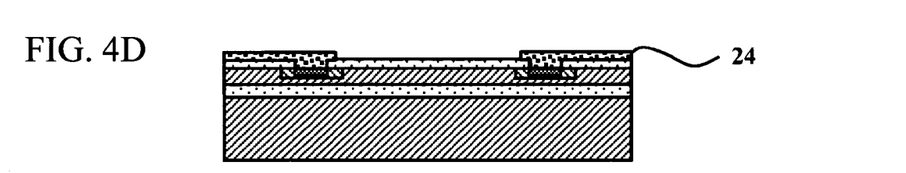

Then, as shown in FIG. 4C, openings are formed in regions in the oxide film 22 that correspond to interconnection contacts for the piezoelectric resistors 11. Subsequently, the boron ions are implanted in the regions through the openings in order to compensate for the interconnection contacts. Thereafter, the substrate 10 is annealed in an atmosphere of nitrogen at 800–1300° C. in order to avoid the leakage in the piezoelectric resistors. Then, an Al—Si alloy film is grown on the whole surface by DC magnetron sputtering. An equal-magnification contact exposure is performed with a minimum feature width of 5 µm. Interconnection 24 are formed by patterning using reactive ion etching (RIE) with a chlorine gas.

Figure 4E:
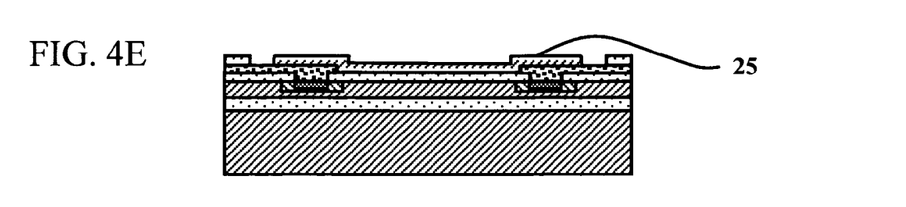
Figure 4F:
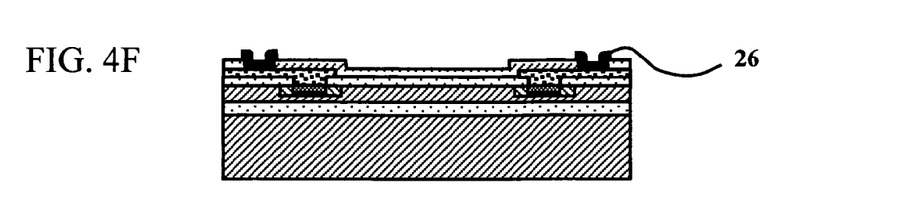

Referring to FIG. 4E, an oxide film 25 is deposited by CVD with TEOS as a source material to protect Al in the interconnections 24, and openings for wire bonding pads are formed by RIE using a CF$_4$ gas. Referring to FIG. 4F, a film laminate of Au(300 nm)/Ti(150 nm) is evaporated on the whole surface, and is lifted off, so that Al pad protection layers 26 thus patterned are formed.

Figure 5A:
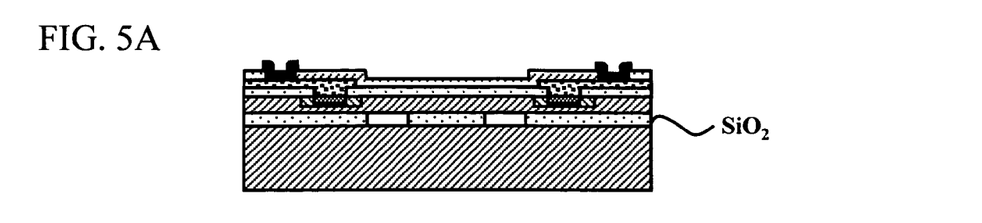
FIGS. 5A through 5E illustrate a process following the process shown in FIGS. 4A through 4F.

Next, referring to FIG. 5A, the silicon surface portion is etched by 10 µm using the RIE process for forming the stoppers, and SiO$_2$ in given areas is removed by etching in a box shape.

Figure 5B:
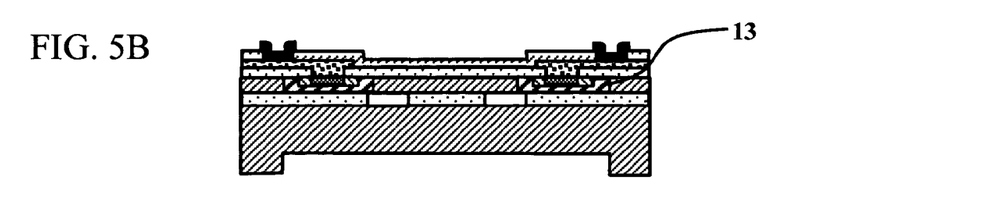

Referring to FIG. 5B, the beams 13 are formed by etching the oxide film 25, the silicon layer (15 µm) that is the main surface of the SOI substrate 10, and the SiO$_2$ layer (1 µm).

Figure 5C:
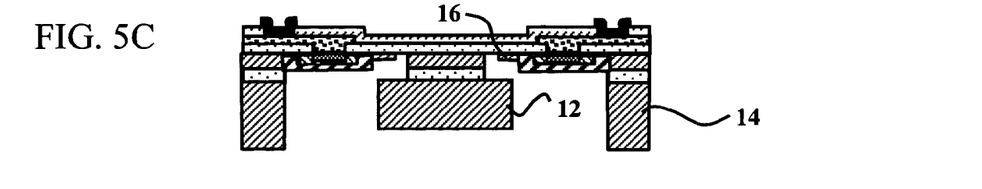

Referring to FIG. 5C, subsequent to the forming of the beams, an alignment exposure is performed on both sides, and the silicon substrate is etched by approximately 500 µm by RIE so as to form the weight 12 having a perpendicularity of 90±1 degrees and the weight stoppers 16. Further, cleaning is performed with a mixed solution of H$_2$SO$_4$ and H$_2$O$_2$ before anode bonding.

Figure 5D:
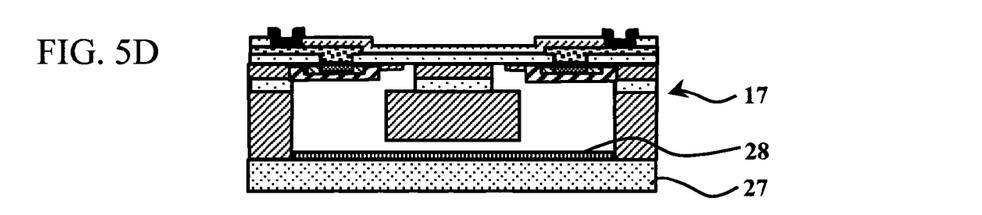

A Cr layer 28 is deposited to a thickness of 200 nm on a glass plate 27, which has the same thermal expansion coefficient as that of the silicon substrate. Anode bonding is performed between the glass plate 27 and sensing portions 17. Subsequent to the anode bonding, the substrate is sintered in an atmosphere of nitrogen. Thus, a number of sensing portions 17 shown in FIG. 5D, are obtained on the SOI substrate 10.

Figure 5E:
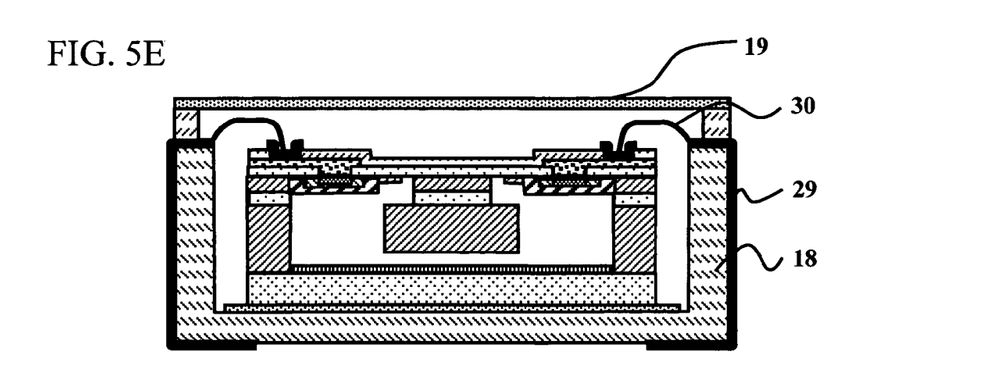

Finally, as shown in FIG. 5E, the substrate is divided into chips by dicing, each chip having the sensing portion 17. Then, each chip with the sensing portion 17 is housed in a package 18. Interconnections 29 provided on the outer surface of the package 18 are connected to the Al pad protection layers 26 by wires 30. A cap 19 is provided to seal the package 18 hermetically. The inertial sensor is thus manufactured.

A narrow gap (clearance) between the weight stoppers and the sensing portion (weight) enhances the impact resistance. However, this results in the narrow movable range of the weight 12 and reduces the dynamic range of the sensor. In contrast to the narrow gap, a wide gap (clearance) widens the movable range of the weight 12. However, if the moveable range is too wide, the weight stoppers do not function effectively and the expected impact resistance cannot be obtained. Thus, the clearance between the weight stoppers and the sensing portion is determined to satisfy both the dynamic range of the sensor and the impact resistance required.

Figure 6:
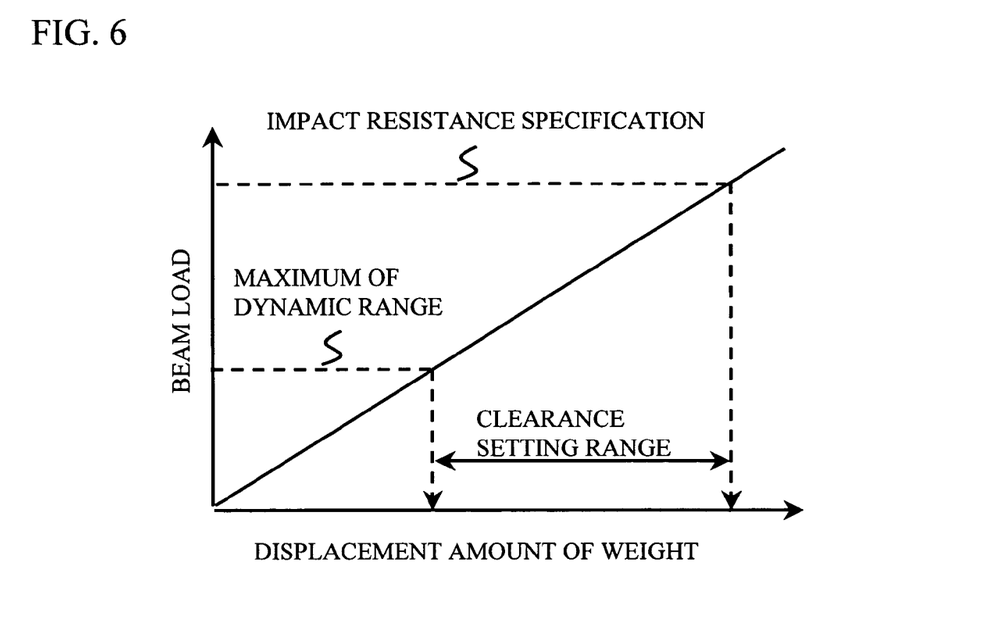
FIG. 6 is a graph showing a concept of the clearance determination and a relationship between the displacement of a weight in the vertical axis and load applied to beams in the horizontal axis)

FIG. 6 is a graph showing a concept of the clearance determination and a relationship between the displacement of the weight 12 (in the vertical axis) and load applied to the beams 14 (in the horizontal axis). The setting of the clearance depends on the maximum dynamic range required for the sensor and the displacement of the weight 12 corresponding to the specification of the impact resistance. The clearance is designed so as to fall within the range that satisfies the above-mentioned two factors. In the clearance designed above, a weight displacement is equal to or greater than the maximum dynamic range, and the impact resistance is equal to or less than the impact resistance specification. Preferably, the clearance is set as narrow as possible. If the clearance is arranged wider than necessary, the weight starts moving due to an accidental impact and greatly accelerates before the weight stopper limits the movement. If the weight hits the weight stopper, the weight might be damaged.

The present invention intends to improve the impact resistance of the inertial sensor, and partly has an object similar to that of Document 1 described previously. However, the present invention achieves the objective by structures different from the structure disclosed in Document 1, as will be described as follows.

First, the device disclosed in Document 1 intends to reduce the impact when a pair of insulating protection covers (package) hit a movable portion. In contrast, the present invention intends to prevent the weight from hitting the package. The impact resistance is improved by limiting the movable range of the weight, which is a movable portion. The device described in Document 1 includes the protector provided on the insulating protective cover. In contrast, the present invention includes the weight stopper in addition to a protective cover.

Second, Document 1 describes, in paragraph 0027 of Document 1, "The concave portion 6Aa having a depth of approximately 15 µm is formed on the surface facing the convex portion 4Ab of the mass body 4Aa in the glass substrate 6A. The aluminum layer 8 having a thickness of approximately 5 µm is coated as a protector to protect against the impact by vapor evaporation". The device disclosed in Document 1 includes the aluminum layer formed for the protector by a general method such as vapor evaporation. In contrast, the present invention includes the weight stopper by the MEMS techniques. The microfabrication technology is employed in producing the weight stopper with the MEMS techniques. This makes it possible to form the weight stopper with fine processing. It is possible to form the weight stopper for improving the impact resistance having a high accuracy without degrading the sensor sensitivity.

Third, Document 1 describes, in paragraph 0026, "the beam supporting the mass body 4Aa has a narrow width in proportion to the thickness thereof, and the mass body 4Aa has a configuration in which the mass body 4Aa has a difficulty of displacing toward the glass substrates 6A and 7A". The device disclosed in Document 1 relates to the acceleration sensor having a mechanism in which the mass body is displaced on a plane (x-y plane) perpendicular to the package surface. Originally, the mass body of the acceleration sensor has a difficulty in moving in the z direction. However, the mass body moves accidentally in the z direction when an impact is applied. In order to enhance the impact resistance of the acceleration sensor, the protector is provided on the package surface positioned in the z direction. It is to be noted that originally, it is hard for the sensor to move in the z direction. In contrast, the present invention relates to the inertial sensor having the weight (the mass body) displaced three-dimensionally. The weight stopper is arranged so as to allow the weight to move three-dimensionally within the dynamic range of the sensor.

Document 1 described in paragraph 0026 "The convex portion 4Ab serves as a stopper to control the displacement toward the glass substrate 6A side". The above-mentioned stopper, or the convex portion of the movable portion, is completely different from the weight stopper in accordance with the present invention.

The weight stopper 16 employed in accordance the present invention has variations and modifications in addition to the examples shown in FIGS. 2A through 2D.

Figure 7A:
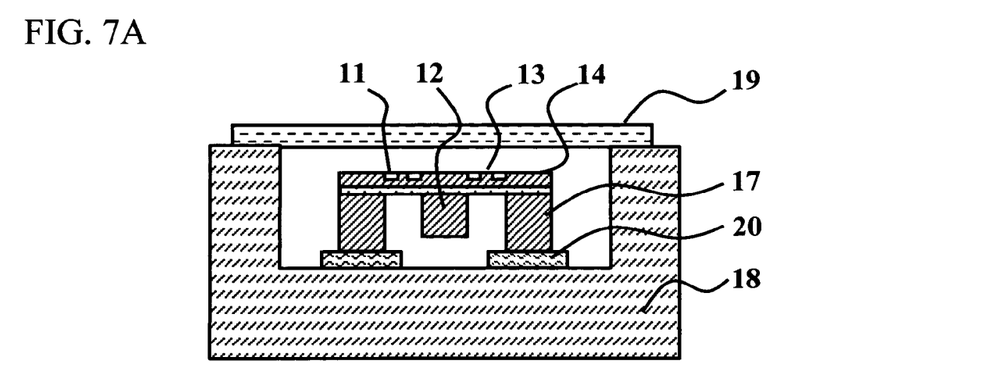
FIGS. 7A and 7B are cross-sectionals views of an inertial sensor equipped with the weight stoppers arranged on an inner surface of a cap and a bottom surface of a cavity in a package.

FIG. 7A is a cross-sectional view of the inertial sensor equipped with the weight stoppers arranged on an inner surface of the cap and a bottom surface of a cavity in the package. The sensing portion 17 is secured to the bottom surface of the cavity in the package 18 with an adhesive agent 20. The cap 19 covers the package 18. The weight stoppers 16 may be provided on the inner surface of the cap 19 or the bottom surface of the cavity in the package in the same manner as shown in FIGS. 2A through 2D.

Figure 7B:
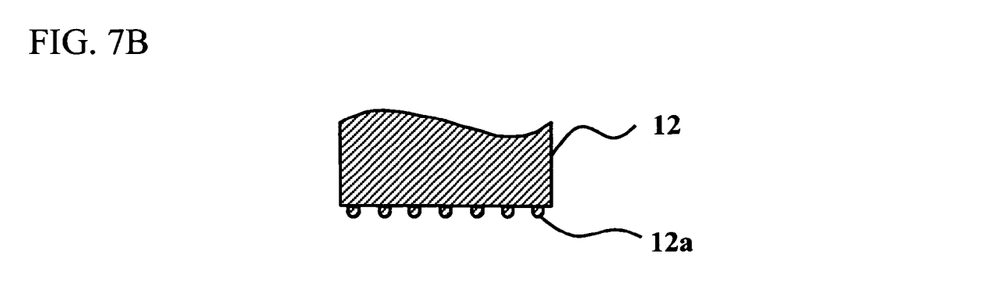

The weight 12 of the sensing portion 17 may have the flat top and bottom surfaces. Alternatively, the weight 12 may have a convex portions 12a as shown in FIG. 7B. The convex portions 12a provide an effective clearance defined by a gap between an apical surface of the convex portions 12a and the surface of the weight stoppers. There is an advantage in that the impact resistance can be improved even in the case where the gap is relatively wide between the weight 12 and the weight stopper. On the contrary, the convex portions 12a may be provided on the surface of the weight stopper 16 facing the weight 12.

Figure 8A:
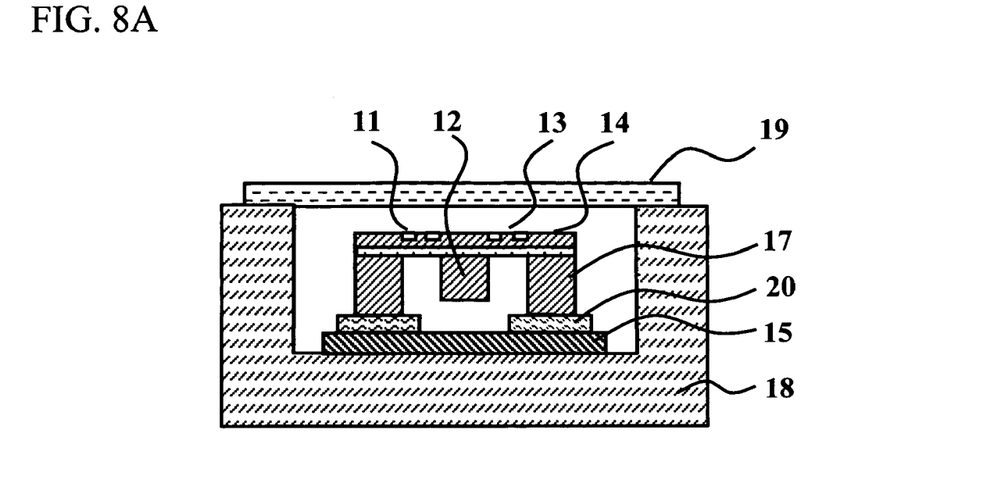
FIGS. 8A and 8B are cross-sectional views of the sensing portion, which is secured to a silicon or glass substrate with an adhesive agent and is incorporated into a package.
Figure 8B:
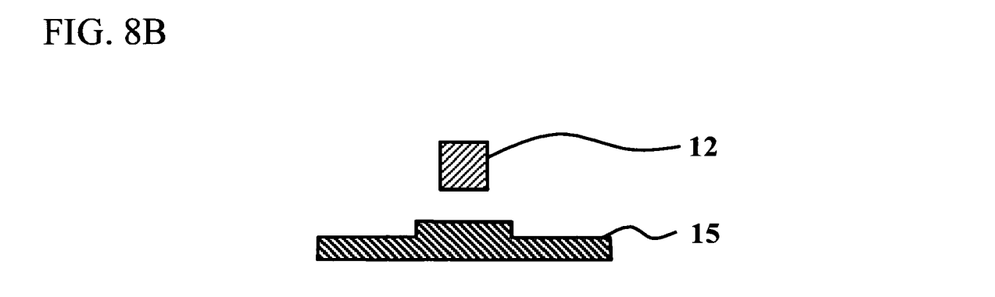

FIG. 8A is a cross-sectional view of the sensing portion, which is secured to the silicon substrate or the glass substrate 15 with the adhesive agent 20 and is incorporated into a package. In this configuration, the weight stopper 16 may be formed in the glass substrate 15, which is a fixing member of the sensing portion. In this case, the convex portion 12a may be arranged on the cap 10 facing the weight 12, the bottom surface of the cavity in the package 18, or a top or bottom surface of the glass substrate 15. Even if the gap is relatively wide between the weight stopper 16 and the weight 12, there is an advantage in that the impact resistance can be enhanced. Referring to FIG. 8B, a given clearance may be obtained by graving the bottom surface of the package 18 and part of the glass substrate 15.

Figure 9:
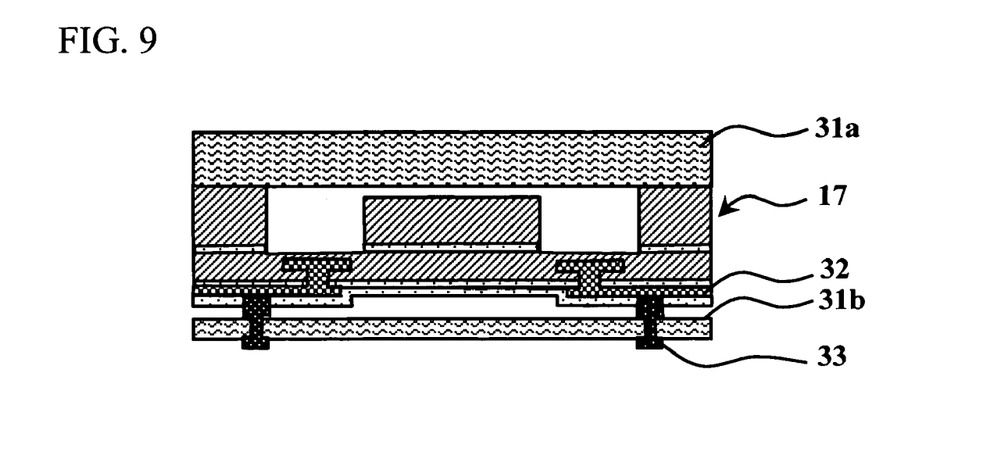
FIG. 9 is a cross-sectional view of the sensing portion and a lower stopper.

FIG. 9 is a cross-sectional view of another version of the sensing portion and a lower stopper. The sensing portion is formed upside down. The lower stopper is formed together with a sensor signal detection circuit made of silicon. The sensing portion 17 is arranged between an upper stopper 31a and a lower stopper 31b. The sensing portion 17 is connected to the lower stopper 31b with bumps 33 with flip-chip technology. The lower stopper 31b also serves as a sensor signal detection circuit, not shown, which detects changes in a signal line 32 included in the sensing portion 17 and the piezoelectric resistor 11 as electronic signals.

Several processes may be employed to realize the designed value of the clearance between the weight 12 and the weight stopper 16 in the above-mentioned variations. For example, the silicon or glass substrate may be etched or sandblasted to obtain a rough surface for providing concave portions or dents on the substrate. A dielectric or metal film may be deposited on the silicon or glass substrate, and the film may be patterned by etching or lift off for providing the convex portions or projections.

Figure 10:
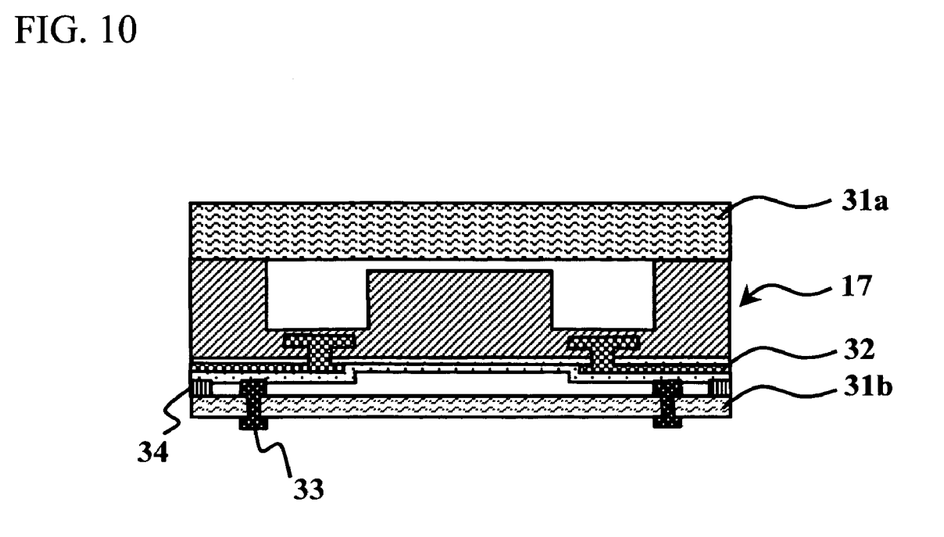
FIG. 10 shows projections arranged on edges of the weight stopper to provide gaps in advance.
Figure 11:
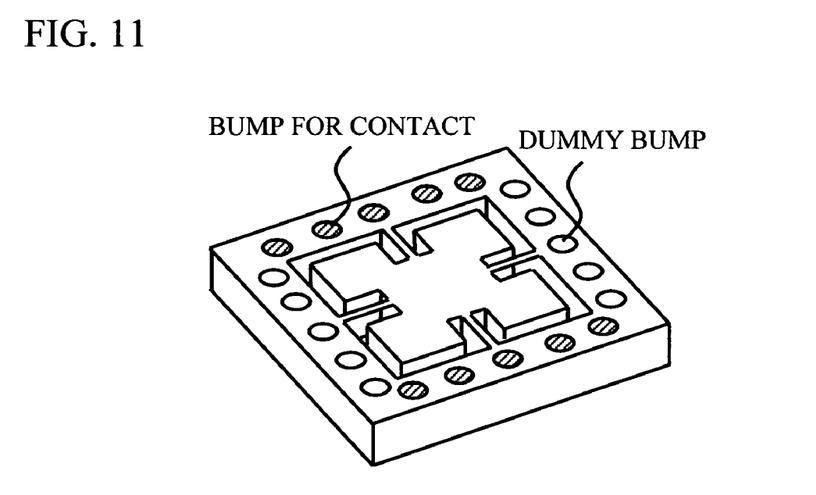
FIG. 11 shows dummy bumps arranged around the sensing portion.

The height of the cap of the package may be controlled by solder used for hermetically seal. The height of the bumps may be varied for adjusting the clearance when flip chip mounting the sensing portion. These cases have a difficulty in arranging the clearance uniformly. This problem may be improved by using spacers 34 on edges for providing the clearance in advance, as shown in FIG. 10. As shown in FIG. 11, when the gaps are provided with the bumps only, it is effective to arrange dummy bumps that provide gaps equal to the regular gaps. The dummy bumps are arranged around the sensing portion to be evenly spaced, in addition to the desired electric connections.

Figure 12A:
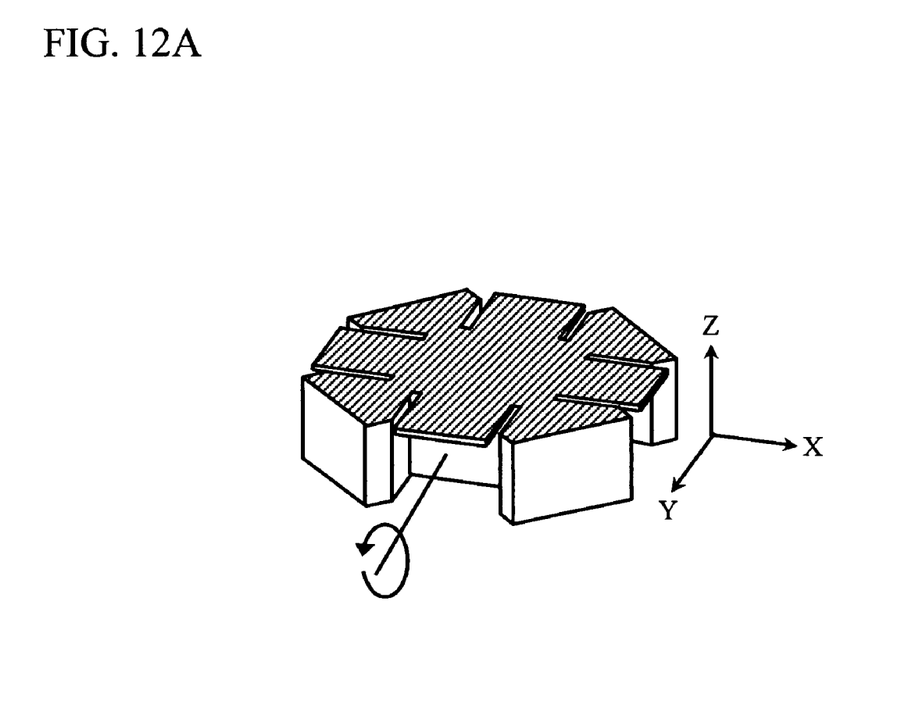
FIG. 12A shows a sensing portion of a gyro in accordance with an aspect of the present invention.
Figure 12B:
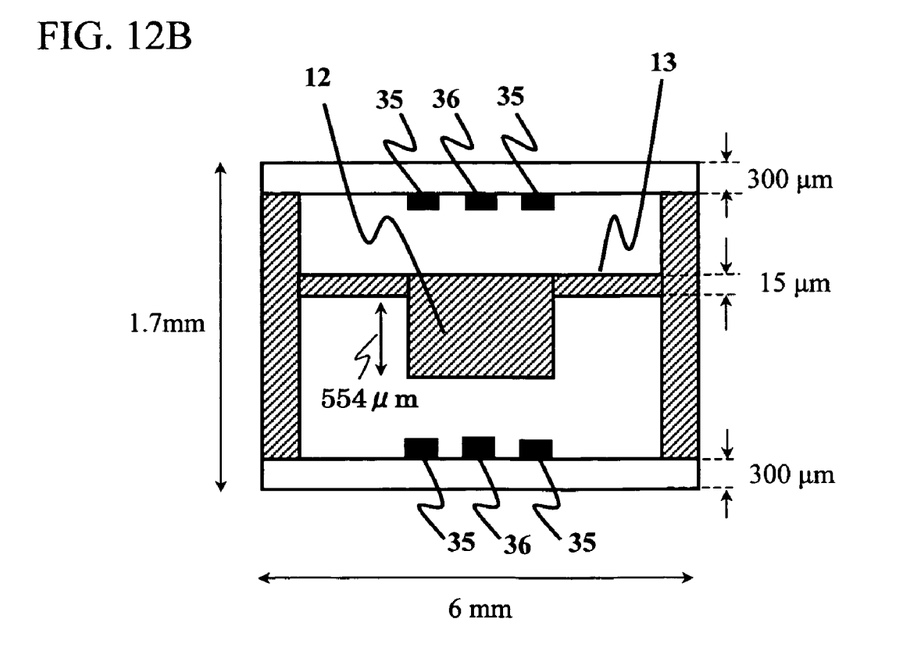
FIG. 12B schematically shows the gyro having the sensing portion shown in FIG. 12A and included in a package.

FIGS. 12A and 12B show a basic structure of a gyro in accordance with the present invention. FIG. 12A shows a sensing portion. FIG. 12B schematically shows the gyro having the sensing portion included in a package. The gyro and the acceleration sensor have no difference in the basic structures thereof. Thus, a description is omitted here. The basic structure of the sensing portion is the same as that of the inertial sensor.

Referring to FIG. 12A, the sensing portion is mounted on the package so as to turn around a y-axis. The package includes detection electrodes 35 and drive electrodes 36.

In accordance with the present invention, it is possible to provide the acceleration sensor or the gyro having a simple structure and the excellent impact resistance.

The present invention is not limited to the above-mentioned embodiments, and other embodiments, variations and modifications may be made without departing from the scope of the present invention.

The present invention is based on Japanese Patent Application No. 2004-099161 filed on Mar. 30, 2004, the entire disclosure of which is hereby incorporated by reference.

What is claimed is:

1. An inertial sensor comprising:
   a sensing portion having a weight supported by beams, the weight being a movable portion; and
   a weight stopper that limits a movable range of the weight,
   the weight stopper being arranged in a vicinity of the weight with a given clearance and being a part of a substrate for the inertial sensor processed with MEMS techniques,
   the weight stopper having a layer identical to an uppermost layer of the weight and having a top surface flush with a top surface of the weight.

2. The inertial sensor as claimed in claim 1, wherein the weight stopper extends toward the weight from a frame that supports the beams, and partially covers gaps between the weight and the frame.

3. The inertial sensor as claimed in claim 1, wherein the weight stopper has a column portion for reinforcing strength of the weight stopper.

4. The inertial sensor as claimed in claim 1, wherein the substrate is made of silicon.

5. The inertial sensor as claimed in claim 4, wherein:
the substrate is an SOI substrate; and
the weight stopper is a part of a silicon film of the SOI substrate.

6. The inertial sensor as claimed in claim 1, wherein the weight stopper is provided on at least one of an inner surface of a cap covering the sensing portion and a bottom surface of a cavity in a package housing the sensing portion.

7. The inertial sensor as claimed in claim 6, further comprising spacers arranged at edges of the weight stopper to control the clearance.

8. The inertial sensor as claimed in claim 6, further comprising bumps arranged in a frame of the sensing portion to control the clearance.

9. The inertial sensor as claimed in claim 1, further comprising projections provided on at least one of a surface of the weight stopper facing the weight and the surface of the weight facing the weight stopper, to control the clearance.

10. The inertial sensor as claimed in claim 1, wherein the clearance is equal to or greater than the movable range of the weight, which corresponds to a dynamic range of the inertial sensor.

11. The inertial sensor as claimed in claim 1, further comprising a package on which the sensing portion is flip-chip mounted.

12. An inertial sensor comprising:
a sensing portion having a weight supported by beams, the weight being a movable portion; and
weight stoppers that limit a movable range of the weight,
the weight stoppers being arranged in a vicinity of the weight with a given clearance defined by MEMS techniques,
each of the weight stoppers having a layer identical to an uppermost layer of the weight and having a top surface flush with a top surface of the weight.

13. The inertial sensor as claimed in claim 12, further comprising a package on which the sensing portion is flip-chip mounted.

14. The inertial sensor as claimed in claim 12, wherein the weight stoppers bridge corner portions of the weight.

15. The inertial sensor as claimed in claim 12, wherein the weight stoppers obliquely bridge corner portions of the weight.

16. The inertial sensor as claimed in claim 12, wherein the weight stoppers are diagonally arranged over the weight.

17. The inertial sensor as claimed in claim 12, wherein the weight has corners having step portions, and the weight stoppers bridge the step portions of the corners of the weight.

* * * * *